(12) United States Patent
Noguchi et al.

(10) Patent No.: US 7,355,214 B2
(45) Date of Patent: Apr. 8, 2008

(54) FIELD EFFECT TRANSISTOR AND FABRICATION THEREOF, SEMICONDUCTOR DEVICE AND FABRICATION THEREOF, LOGIC CIRCUIT INCLUDING THE SEMICONDUCTOR DEVICE, AND SEMICONDUCTOR SUBSTRATE

(75) Inventors: Takashi Noguchi, Kanagawa (JP); Mitsuo Soneda, Kanagawa (JP)

(73) Assignee: Sony Corporation (JP)

( * ) Notice: Subject to any disclaimer, the term of this patent is extended or adjusted under 35 U.S.C. 154(b) by 117 days.

(21) Appl. No.: 10/752,705

(22) Filed: Jan. 8, 2004

(65) Prior Publication Data

US 2004/0135210 A1 Jul. 15, 2004

Related U.S. Application Data

(62) Division of application No. 09/048,288, filed on Mar. 26, 1998, now Pat. No. 6,682,965.

(30) Foreign Application Priority Data

Mar. 27, 1997 (JP) ............................... P09-074746

(51) Int. Cl.
*H01L 31/0328* (2006.01)
(52) U.S. Cl. ................. 257/190; 257/192; 257/616
(58) Field of Classification Search ........ 257/190–192, 257/616
See application file for complete search history.

(56) References Cited

U.S. PATENT DOCUMENTS

| 5,155,571 | A | 10/1992 | Wang et al. |
|---|---|---|---|
| 5,241,197 | A | 8/1993 | Murakami et al. |
| 5,665,616 | A | 9/1997 | Kimura et al. |
| 5,998,807 | A | 12/1999 | Lustig et al. |
| 2002/0011617 | A1 | 1/2002 | Kubo et al. |

FOREIGN PATENT DOCUMENTS

| JP | 03-187269 | 8/1991 |
|---|---|---|
| JP | 07-321222 | 12/1995 |
| JP | 08-111528 | 4/1996 |
| JP | 08-213616 | 8/1996 |

OTHER PUBLICATIONS

K. Ismail et al., "Electron transport properties of Si/SiGe heterostructures: Measurements and device implications", Applied Physics Letters, vol. 63, Aug. 2, 1993, No. 5, pp. 660-662.
L. H. Jiang, "Electrical Properties of GeSi Surface- and Buried-Channel p-MOSFET's Fabricated by Ge Implantation", IEEE Electron Devices, vol. 43, Jan. 1996, No. 1, pp. 97-103.
K. Ismail et al., "High Pole Mobility In SiGe Alloys For Device Applications", Applied Physics Letters, vol. 64, Jun. 6, 1994, No. 23, pp. 3124-3126.
J. Welser et al., "Strain Dependence of the Performance Enhancement in Strained-Si n-MOSFETs", Electron Devices Meeting, 1994, pp. 373-376.

*Primary Examiner*—Jack Chen
(74) *Attorney, Agent, or Firm*—Rader Fishman & Grauer PLLC; Ronald P. Kananen

(57) ABSTRACT

A method for forming a Field Effect Transistor (FET) within a strain effect semiconductor layer is disclosed, whereby the source and drain of the FET are formed only in the strain effect silicon layer. The FET may be formed as a gate electrode of a p-channel type field effect transistor, and a gate electrode of a n-channel type field effect transistor on the silicon layer which has the strain effect through a gate insulating film. The sources and drains of p- and n-type diffusion layers are then formed in the silicon layer having the strain effect, on both sides of the gate electrode.

12 Claims, 8 Drawing Sheets

FIELD EFFECT TRANSISTOR AND FABRICATION THEREOF, SEMICONDUCTOR DEVICE AND FABRICATION THEREOF, LOGIC CIRCUIT INCLUDING THE SEMICONDUCTOR DEVICE, AND SEMICONDUCTOR SUBSTRATE

This Application is a Divisional application Ser. No. 09/048,288 filed Mar. 26, 1998 now U.S. Pat. No. 6,682,965.

BACKGROUND OF THE INVENTION

The present invention relates to a field effect transistor and a fabrication method thereof, a semiconductor device and a fabrication method thereof, a logic circuit including the semiconductor device, and a semiconductor substrate, and particularly to a field effect transistor in which a source/a drain are formed in a silicon layer having a strain effect and a fabrication method thereof, a semiconductor device including the field effect transistor and a fabrication method thereof, a logic circuit including the semiconductor device, and a semiconductor substrate on which the field effect transistor, the semiconductor device, or the logic circuit is formed.

With the advance of a technique of forming a thin film made from a group IV semiconductor material such as silicon/silicon germanium, devices using materials having a strain effect have been allowed to be fabricated, and at present, studies are being extensively made to realize high function and low voltage devices using materials having a strain effect.

The strain effect means a phenomenon that in a thin film semiconductor applied with a stress, an energy band is distorted to change an effective mass of carriers. A semiconductor thin film having such a strain effect has been allowed to be realized by forming a multi-layered film such as silicon/silicon germanium in such a manner as to control an inner stress of the film using a molecular beam epitaxy technique or an ultra-high vacuum chemical vapor deposition (UHV-CVD) process. High quality MOS based devices or sensors have been also developed by controlling a difference in band gap or a film strain through hetero-junction.

A silicon film on a SOI (Silicon on Insulator) substrate formed using a technique of forming a single crystal silicon film by zone melting or irradiation of argon ion laser is applied with a tensile stress. Besides, a silicon film on a SOS (Silicon on Sapphire) substrate is applied with a compressive stress. As a result, for the former silicon film, the mobility of electrons becomes larger and for the latter silicon film, the mobility of positive holes becomes larger. In other words, for the former, the mobility of positive holes becomes smaller and for the latter, the mobility of electrons becomes smaller For a silicon based MOS (Metal-Oxide-Semiconductor) transistor, by depositing a silicon film on an epitaxial layer made from silicon germanium whose stress is relaxed, the mobility of electrons is made larger by a tensile stress (which is strictly explained such that six regenerated bands are divided into two bands different in effective mass of electrons). Besides, in the case of formation of silicon germanium containing germanium in a large amount (that is, a germanium rich silicon germanium), the mobility of positive holes are made larger by a compressive stress.

In a MOS transistor prepared such that the stress of a channel layer is controlled by forming a multi-layered film based on the above property of the strain effect silicon layer, a high mutual conductance [gm (mobility)] can be obtained. Such a p-type MOS is disclosed in Appl. Phys. Letter (USA), 63 (1993) K. Ismail et al., p660 and IEEE Electronic Devices (USA), 43 (1996) L. H. Jiang and R. G. Elliman, p97. Further, an nMOS is disclosed in Appl. Phys. Letter (USA), 64 (1994) K. Ismail et al., p3124 and IEDM 94-37 (USA), (1994) J. Welser et al.

A pass-transistor, as the advanced high performance logic operable at a low voltage, has been proposed in the field of the advanced applied technology such as a CPU (Central Processing Unit) or MPEG (Moving Picture Experts Group). In such a logic circuit, an nMOS transistor as a main component requires such a high level characteristic as to exhibit a high mutual conductance with a low voltage operation. Besides, a pMOS transistor is used for precharge or the like and has less number of elements. That is, the pMOS transistor does not require a higher operational speed as compared with the nMOS, and therefore, it is not disadvantageous from the a real viewpoint even if the performance is determined by adjustment of the channel width W.

In the case where the above-described related art pMOS or nMOS transistor is used in an application requiring a high performance at a low voltage, however, there occurs a problem of a junction leak of the transistor because the junction of the source/drain is positioned in a silicon germanium layer having a small band gap or formed at an interface of silicon/silicon germanium.

OBJECT AND SUMMARY OF THE INVENTION

An object of the present invention is to solve the above-described problem and to provide a field effect transistor and a fabrication method thereof, a semiconductor device and a fabrication method thereof, a logic circuit including the semiconductor device, and a substrate, in which the junction of a source/a drain is formed in a strain effect silicon layer for suppressing occurrence of a junction leak of the transistor.

To achieve the above object, according to a first aspect of the present invention, there is provided a field effect transistor formed in a silicon layer as a semiconductor layer having a strain effect (hereinafter, referred to as "a strain effect silicon layer) formed in an upper layer of a semiconductor substrate, the field effect transistor including: a source/a drain formed only in the semiconductor layer having the strain effect.

In this field effect transistor, since the source/drain are formed only in the strain effect silicon layer, the junction of the source/drain is present in the strain effect silicon layer, to improve the mobility of the transistor, thereby improving the performance of the transistor.

According to a second aspect of the present invention, there is provided a method of fabricating a field effect transistor, including the steps of: forming a semiconductor substrate in such a manner that a strain effect silicon layer is formed in an upper layer of the semiconductor substrate; forming a gate electrode on the strain effect silicon layer through a gate insulating film; and forming a source/a drain by doping an impurity for forming the source/drain in the strain effect silicon layer on both sides of the gate electrode.

In this method of fabricating a field effect transistor, since the source/drain of the field effect transistor are formed only in the strain effect silicon layer, the junction of the source/ drain is formed in the strain effect silicon layer, to thereby suppress occurrence of a junction leak of the transistor.

According to a third aspect of the present invention, there is provided a semiconductor device including: a p-channel type field effect transistor and an n-channel type field effect transistor both formed in a strain effect silicon layer formed in an upper layer of a semiconductor substrate, wherein a source/a drain of the p-channel type field effect transistor and a source/a drain of the n-channel type field effect transistor are formed only in the strain effect silicon layer.

In this semiconductor device, since each source/drain of the p-channel type and n-channel type field effect transistors are formed only in the strain effect silicon layer, the junction of the source/drain is present in the strain effect silicon layer, to thereby suppress occurrence of a junction leak of the transistor.

The above semiconductor device also has a structure being substantially similar to a related art CMOS structure because each source/drain of the p-channel type and n-channel type transistors are formed in one strain effect silicon layers. As a result, the structure of the semiconductor device is simplified.

According to a fourth aspect of the present invention, there is provided a method of fabricating a semiconductor device, including the steps of: forming a semiconductor substrate in such a manner that a strain effect silicon layer is formed in an upper layer of the semiconductor substrate; forming a gate electrode of a p-channel type field effect transistor and a gate electrode of a n-channel type field effect transistor on the strain effect silicon layer through a gate insulating film; forming a source/a drain composed of p-type diffusion layers in the strain effect silicon layer on both sides of the gate electrode of the p-channel type field effect transistor; and forming a source/a drain composed of n-type diffusion layers in the strain effect silicon layer on both sides of the gate electrode of the n-channel type field effect transistor.

In this method of fabricating a semiconductor device, since each source/drain of the p-channel type and n-channel type field effect transistors are formed only in the strain effect silicon layer, the junction of each source/drain is formed only in the strain effect silicon layer, to thereby suppress occurrence of a junction leak in each source/drain.

In this method, since each source/drain are formed in one strain effect silicon layer, it is possible to eliminate the need of provision of a channel forming layer corresponding to each source/drain, and hence to simplify the fabrication process.

According to a fifth aspect of the present invention, there is provided a logic circuit including: a semiconductor device having a p-channel type field effect transistor and an n-channel type field effect transistor; wherein a semiconductor substrate on which the logic circuit is formed includes a semiconductor substrate in which a silicon layer having a strain effect is formed in an upper layer thereof; a source/a drain of the p-channel type field effect transistor are formed only in the silicon layer having the strain effect; and a source/a drain of the n-channel type field effect transistor are formed only in the silicon layer having the strain effect.

In this logic circuit, since each source/drain of both the field effect transistors are formed only in the strain effect silicon layer formed in the upper layer of the semiconductor substrate, the junction of each source/drain is present in the strain effect silicon layer, to improve the mobility of each transistor and suppress occurrence of a junction leak of the transistor, thereby improving the performance of each transistor.

The semiconductor device formed in the above logic circuit has a structure being substantially similar to a related art CMOS structure because each source/drain of the p-channel type and n-channel type transistors are formed in one strain effect silicon layers. As a result, the structure of the semiconductor device is simplified.

According to a sixth aspect of the present invention, there is provided a semiconductor substrate including: a germanium base; a relax layer formed on the germanium base, the relax layer being composed of a silicon germanium layer whose stress is relaxed; and a silicon formed on the relax layer, the silicon layer having a strain effect.

In this semiconductor substrate, since the base is formed of the germanium base, the relax layer composed of the silicon germanium layer whose stress is relaxed can be formed not through a buffer layer but directly on the germanium base. To be more specific, since there is less possibility of occurrence of lattice mismatching between the germanium base and the relax layer, the above configuration can be adopted.

The above configuration makes it possible to simplify the structure of the semiconductor substrate and hence to simplify the process of forming the semiconductor substrate.

DETAILED DESCRIPTION OF THE PREFERRED EMBODIMENTS

Hereinafter, preferred embodiments will be described with reference to the accompanying drawings.

Figure 1:
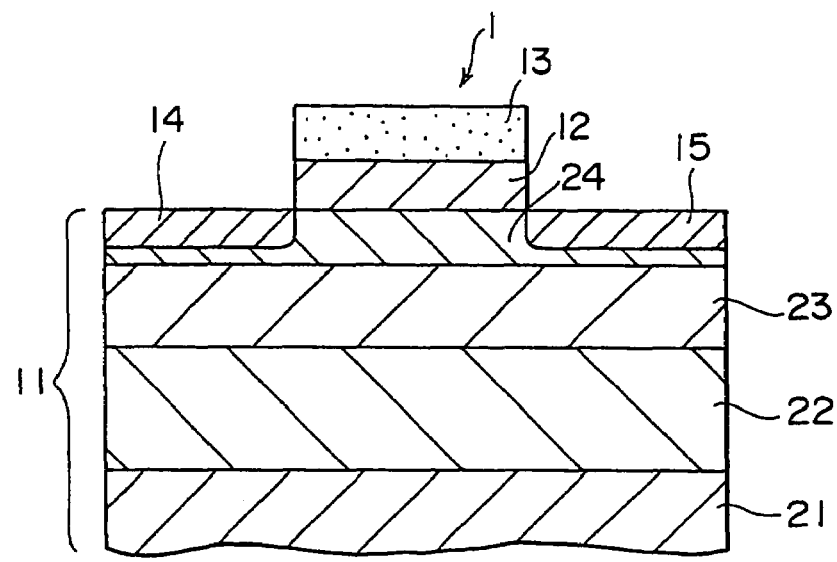
FIG. 1 is a sectional view schematically showing a configuration of a first embodiment of a field effect transistor of the present invention.

A first embodiment of a field effect transistor of the present invention will be described with reference to FIG. 1. FIG. 1 is a sectional view schematically showing a configuration of an insulated gate type n-MOSFET as one example of the first embodiment.

First, as shown in FIG. 1, a buffer layer 22 and a relax layer 23 are formed on a silicon base 21 in this order. The buffer layer 22 is made from a p⁻-type silicon germanium ($Si_{1-x}Ge_x$) in which the concentration of germanium is changed in the thickness direction. The relax layer 23 is made from a p⁻-type silicon germanium ($Si_{1-x}Ge_x$) whose stress is relaxed.

To be more specific, the above silicon base 21 is made from p⁻-type silicon grown by a Czochralski (CZ) process. The buffer layer 22 is made from silicon germanium in which the composition of germanium is changed from x=0.04 to x=0.3 from the silicon base 21 side to the upper layer side, and is formed to a thickness of about 1.6 μm. The relax layer 23 is made from silicon germanium in which the composition of germanium is set at x=0.3, and is formed to a thickness of about 0.6 μm.

A strain effect silicon layer 24 as a semiconductor layer having a strain effect is formed on the relax layer 23 to a thickness of 13 nm. The thickness of the strain effect silicon layer 24 may be set at a value allowing the strain effect silicon layer 24 to exhibit the strain effect, for example, in a range of about 5 nm to 30 nm, preferably, in a range of 5 nm to 15 nm.

The silicon base 21, buffer layer 22, relax layer 23, and strain effect silicon layer 24 constitute a semiconductor substrate 11 on which a field effect transistor 1 is to be formed.

The field effect transistor 1 is formed on the semiconductor substrate 11 as follows:

A gate electrode 13 is formed on the strain effect silicon layer 24 through a gate insulating film 12, and a source/a drain 14 and 15 are formed in an upper portion of the strain effect layer 24 on both sides of the gate electrode 13. The gate insulating film 12 is made from a silicon oxide film having a thickness of 6 nm, and the gate electrode 13 is made from polysilicon. The source/drain 14 and 15 are formed such that the junction depth thereof becomes about 5 nm. Accordingly, the source/drain 14 and 15 are formed only in the strain effect silicon layer 24 having the thickness of 13 nm.

Here, the above-described strain effect will be described.

The strain effect means a phenomenon that in a thin film semiconductor applied with a stress, an energy band thereof is distorted to change an effective mass of carriers. In this case, for the semiconductor applied with a tensile stress, the mobility of electrons becomes larger (the mobility of positive holes becomes smaller), while for the semiconductor applied with a compressive stress, the mobility of positive holes becomes larger (the mobility of electrons becomes smaller).

In the above-described field effect transistor 1, since the source/drain 14 and 15 (junction depth: 5 nm) are formed only in the strain effect silicon layer 24 having the thickness of 13 nm, the junction of the source/drain 14 and 15 is present only in the strain effect silicon layer 24, to thereby suppress occurrence of a junction leak of the field effect transistor 1. Further, in the strain effect silicon layer 24, the silicon network is applied with a tensile stress due to a difference in lattice constant between silicon and silicon germanium constituting the relax layer 23. A channel layer of the field effect transistor 1 is formed in such a strain effect silicon layer 24, with a result that degeneration of a bottom of a conduction band is released, so that the effective mass of electrons is made smaller and the mobility of electrons is increased to a value being nearly doubled. Thus, the mutual conductance gm of the field effect transistor 1 as the n-MOS transistor is improved to a value being nearly doubled.

Figure 2:
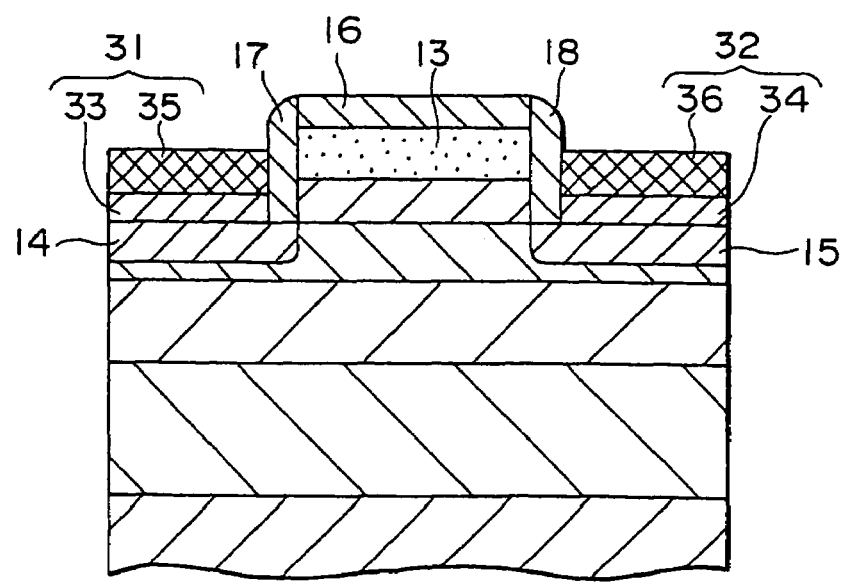
FIG. 2 is a sectional view schematically showing a configuration of a second embodiment of the field effect transistor of the present invention.

A second embodiment of the field effect transistor of the present invention will be descried with reference to FIG. 2.

In FIG. 2, which schematically shows a configuration of the field effect transistor, parts corresponding to those in FIG. 1 are indicated by the same characters as those in FIG. 1.

A field effect transistor 2 shown in FIG. 2 is configured that in the field effect transistor 1 shown in FIG. 1, a source/a drain 31 and 32 of a so-called elevated type are formed on the source/drain 14 and 15.

The elevated source/drain 31 and 32 are composed of silicon epitaxial layers 33 and 34 formed on the source/drain 14 and 15 and refractory metal silicide layers 35 and 36 formed on the silicon epitaxial layers 33 and 34. The silicon epitaxial layers 33 and 34 are formed to a thickness of about 50 nm.

An offset insulating film 16 is formed on the gate electrode 13, and side wall insulating films 17 and 18 are formed on side walls of the gate electrode 13, to thereby prevent short-circuit between the gate electrode 13 and the elevated source/drain 31 and 32.

The source/drain 14 and 15 may be of a LDD (Lightly Doped Drain) structure in which lightly doped layers are formed in the strain effect silicon layer 24 at regions under the side wall insulating films 17 and 18.

The gate electrode 13 may be of a polycide structure. In this polycide structure, the offset insulating film 16 is not required to be formed.

In the field effect transistor 2, since the elevated source/drain 31 and 32 are formed, a sheet resistance of the source/drain 14 and 15 can be reduced without the need of silicifying the source/drain 14 and 15. This allows the field effect transistor 2 to be more stably operated at a high speed.

Figure 3A:
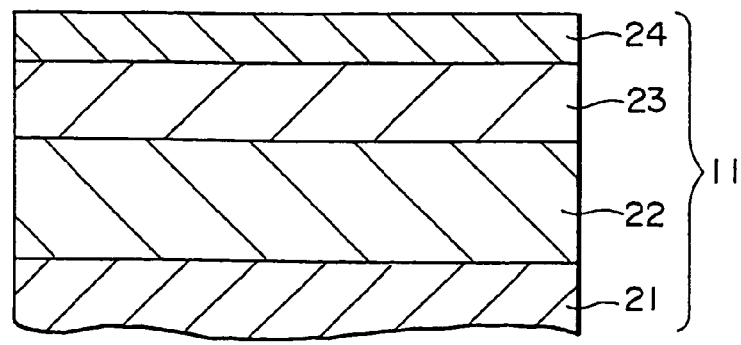
FIGS. 3A to 3C are a flow chart showing a first embodiment of a method of fabricating a field effect transistor according to the present invention.
Figure 3B:
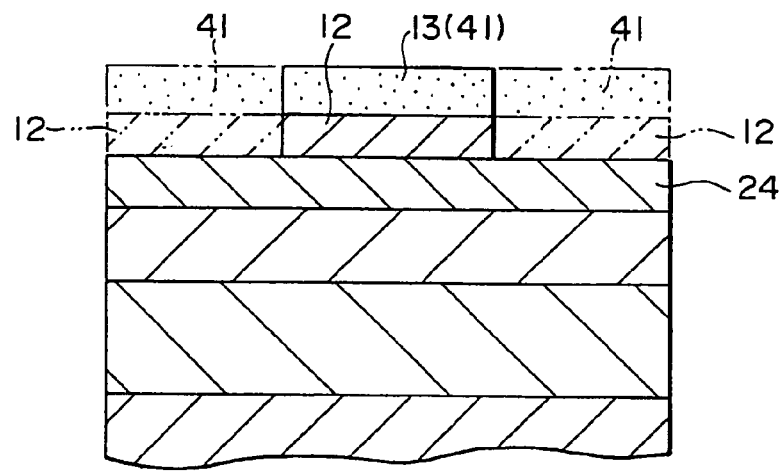
Figure 3C:
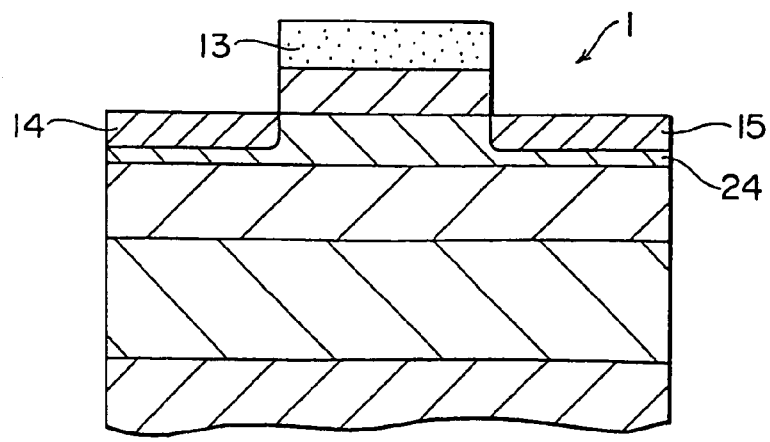

Next, a first embodiment of a method of fabricating a field effect transistor according to the present invention will be described with reference to a flow chart shown in FIGS. 3A to 3C. In FIGS. 3A to 3C, parts corresponding to those in FIG. 1 are indicated by the same characters as those in FIG. 1.

As shown in FIG. 3A, a buffer layer 22 made from p⁻-type silicon germanium ($Si_{1-x}Ge_x$) in which the concentration of germanium is changed in the thickness direction, is formed on a silicon base 21 to a thickness of 1.6 μm by deposition of silicon germanium using an epitaxial growth technique such as ultra-high vacuum chemical vapor deposition (UHV-CVD) or molecular beam epitaxy (MBE) in such a manner that the composition of germanium is changed from x=0.04 to x=0.3 from the silicon base 21 side to the upper layer side. As the silicon base 21, there is used a p⁻-type silicon base produced by the CZ (Czochralski) process.

A relax layer 23 made from p⁻-type silicon germanium whose stress is relaxed is deposited on the buffer layer 22 to a thickness of about 0.6 μm. In this case, the composition of germanium is set at x=0.3.

A strain effect silicon layer 24 as a semiconductor layer having a strain effect is formed on the relax layer 23 to a thickness of 13 nm. The thickness of the strain. effect silicon layer 24 may be set at a value allowing the strain effect silicon layer 24 to exhibit the strain effect, for example, in a range of 5 nm to 30 nm, preferably, in a range of 5 nm to 15 nm.

In the case of adoption of, for example, the UHV-CVD process, the strain effect silicon layer 24 is formed at an atmospheric pressure of 1.33 μPa and a substrate temperature of about 600° C. using as a source gas monosilane ($SiH_4$) at a flow rate of 20 sccm (standard cubic centimeters per minutes) or disilane ($Si_2H_6$) at a flow rate of 5 sccm.

The buffer layer 22, relax layer 23, and strain effect silicon layer 24 are preferably continuously formed in the same chamber. In this case, the buffer layer 22 and relax layer 23 are formed by continuously depositing silicon germanium layers each having a desired composition in such a manner that a mixing ratio of a mixed source gas composed of monosilane ($SiH_4$) and germane ($GeH_4$), or disilane ($Si_2H_6$) and germane ($GeH_4$), followed by stoppage of supply of germane, and the strain effect silicon layer 24 is formed using monosilane or disilane.

In the strain effect silicon layer 24 formed by the above-described process, there is generated a tensile stress due to a difference in lattice constant between the silicon germanium layer (relax layer 23) and the silicon layer (strain effect silicon layer 24).

The silicon base 21, buffer layer 22, relax layer 23, and strain effect silicon layer 24 constitute a semiconductor substrate 11.

Next, as shown in FIG. 3B, a gate insulating film 12 made from silicon oxide is formed on the strain effect silicon layer 24. A gate electrode film 41 (including a portion indicated by chain lines) is formed by deposition of polysilicon using CVD. Then, a resist film (not shown) is formed by coating of resist, followed by patterning of the resist film by photolithography to form a resist mask (not shown), and the gate electrode film 41 is etched using the resist mask as an etching mask, to form a gate electrode 13. At this etching step, a portion of the gate insulating film 12 indicated by chain lines is also etched.

As shown in FIG. 3C, ions of an impurity for forming a source/a drain are implanted in the strain effect silicon layer 24 on both sides of the gate electrode 13 using the gate electrode 13 as a mask, to form an n-type source/an n-type drain 14 and 15 in an upper portion of the strain effect silicon layer 24.

In the case of using ions of arsenic ($As^+$) as the impurity, the above ion implantation conditions are set as follows: the implantation energy is selected at 5 keV; the projection range of ions of arsenic is set at 6 nm; and the dose of ions of arsenic is set at $5 \times 10^{15}$ ions/cm$^2$.

The ion implantation is followed by activation annealing. In the case of using furnace annealing, the annealing temperature is set at 800° C. and the annealing time is set at 20 min, while in the case of using RTA (Rapid Thermal Annealing), for example, ELA (Excimer Laser Annealing), the energy of irradiated laser light is set at 1 J/cm$^2$. Such activation annealing allows formation of a shallow junction of the source/drain 14 and 15 (junction depth: about 6 nm).

To ensure formation of a shallow junction, such annealing is preferably performed by RTA or ELA.

A field effect transistor 1 is thus formed.

Although the source/drain 14 and 15 are formed by ion implantation in this embodiment, the present invention is not limited. For example, the source/drain 14 and 15 may be formed using laser doping, vapor-phase doping, or solid-phase doping.

In the above-described method of fabricating a field effect transistor in this embodiment, since the source/drain 14 and 15 of the field effect transistor 1 are formed only in the strain effect silicon layer 24, the junction of the source/drain 14 and 15 is formed only in the strain effect silicon layer 24, to thereby suppress occurrence of a junction leak of the field effect transistor 1 formed in accordance with this method.

Figure 4A:
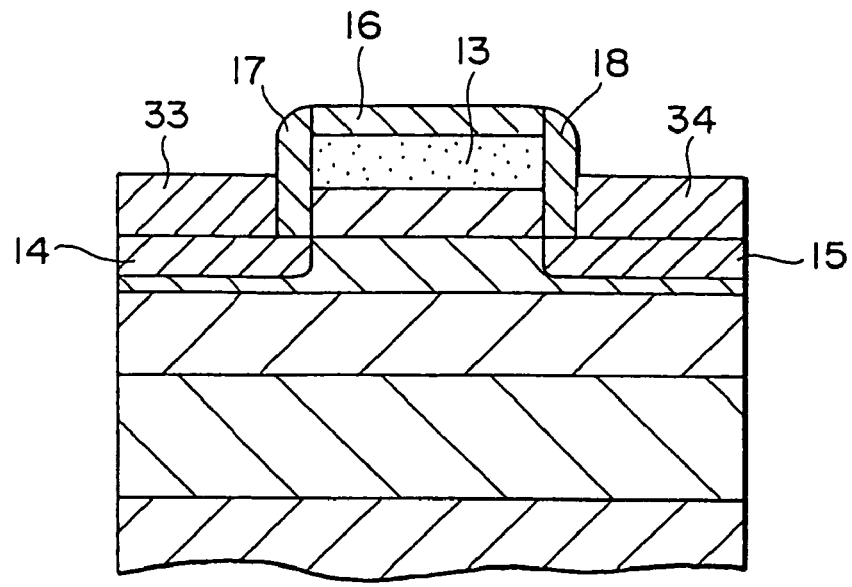
FIGS. 4A and 4B are a flow chart showing a second embodiment of the method of fabricating a field effect transistor according to the present invention.
Figure 4B:
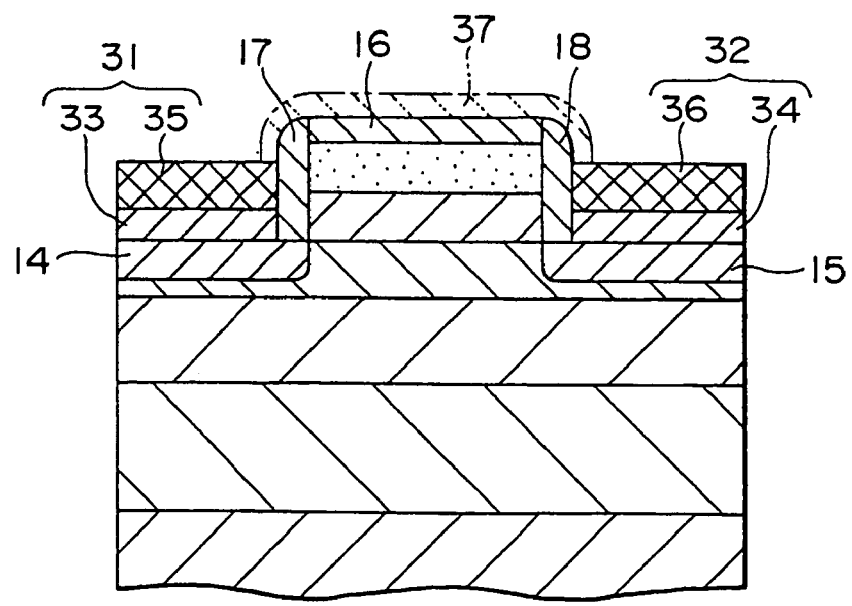

A second embodiment of the method of fabricating a field effect transistor according to the present invention will be described with reference to a flow chart shown in FIGS. 4A and 4B. In FIGS. 4A and 4B, parts corresponding to those shown in FIGS. 3A, 3B and 3C are indicated by the same characters as those in FIGS. 3A, 3B and 3C.

After formation of the gate electrode film 41 in accordance with the method of fabricating the field effect transistor described with reference to FIGS. 3A, 3B and 3C, as shown in FIG. 4A, an offset insulating film 16 is formed on a portion of the gate electrode film 41 forming the gate electrode 13, followed by patterning of the gate. The source/drain 14 and 15 are then formed, and side wall insulating films 17 and 18 are formed.

Then, silicon is selectively deposited on the source/drain 14 and 15 by a selective epitaxial growth process, to form silicon epitaxial layers 33 and 34 on the source/drain 14 and 15 to a thickness of about 50 nm.

In the case of formation of the source/drain 14 and 15 having a LDD (Lightly Doped Drain) structure, after patterning of the gate, lightly doped diffusion layers for forming the LDD structure are formed in the strain effect silicon layer 24 are regions under side wall insulating films (formed later) by ion implantation. Then, side wall insulating films 17 and 18 are formed on side walls of the gate electrode 13, to form highly doped regions for the source/drain 14 and 15.

As shown in FIG. 4B, a refractory metal layer 37 is formed over the entire surface on the side of the silicon expitaxial layers 33 and 34 by sputtering or CVD. Then, silicon in the silicon epitaxial layers 33 and 34 is allowed to react with a metal in the refractory metal layer 37 by heat-treatment (for example, RTA), to form refractory metal silicide layers 35 and 36 in the silicon epitaxial layers 33 and 34. The refractory metal layer is formed of, for example, a titanium layer. In this case, the refractory metal silicide layers 35 and 36 are titanium silicide layers.

A non-reaction portion (indicated by chain lines) of the refractory metal layer 37 on the offset insulating film 16 and the side wall insulating films 17 and 18 is removed by etching.

Thus, a source/a drain 31 and 32, of an elevated type, formed of the high melting point silicide layers 35 and 36 formed on the silicon epitaxial layers 33 and 34 are formed on the source/drain 14 and 15, to form a field effect transistor 2.

In the case where the gate electrode 13 of a polycide structure is formed in the above silicification, the offset insulating film 16 is not required to be formed and the refractory metal layer 37 may be formed in contact with the gate electrode 13.

In the above-described method of fabricating the field effect transistor 2, since the elevated source/drain 31 and 32 are formed by silicifying the upper portions of the silicon epitaxial layers 33 and 34 deposited on the source/drain 14 and 15, the source/drain 14 and 15 are not silicified. As a result, a sheet resistance of the source/drain 14 and 15 can be reduced in such a state as to keep a shallow junction of the source/drain 14 and 15.

Figure 5:
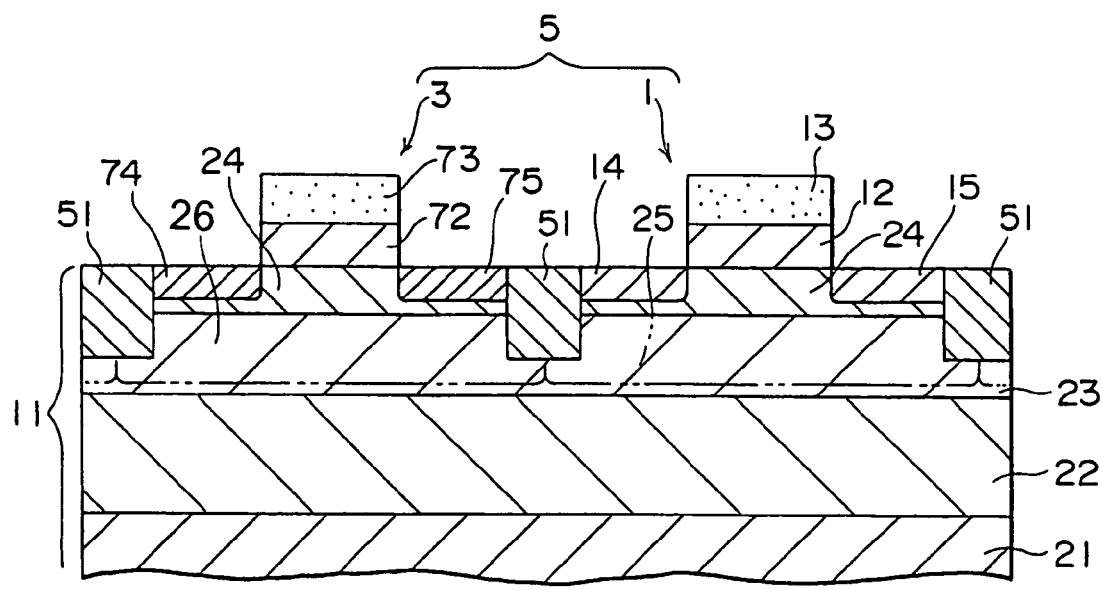
FIG. 5 is a sectional view schematically showing a configuration of a first embodiment of a semiconductor device of the present invention.

Next, a first embodiment of a semiconductor device of the present invention will be described with reference to FIG. 5. In FIG. 5, which schematically shows a configuration of the semiconductor device of the present invention, parts corresponding to those shown in FIG. 1 are indicated by the same characters as those in FIG. 1.

A semiconductor substrate 11 is so configured as shown in FIG. 5.

A buffer layer 22, a relax layer 23, and a strain effect silicon layer 24 are formed on a silicon base 21 in this order.

The silicon base 21 is made from p$^-$-type silicon growth by the Czochralski (CZ) process. The buffer layer 22 is made from p$^-$-type silicon germanium ($Si_{1-x}Ge_x$) in which the concentration of germanium is changed in the thickness direction, typically, in which the composition of germanium is changed from x=0.04 to x=0.3 from the silicon base 21 side to the upper layer side. The buffer layer 22 is formed to a thickness of 1.6 μm.

The relax layer 23 is made from n⁻-type silicon germanium ($Si_{0.7}Ge_{0.3}$) whose stress is relaxed, and is formed to a thickness of 0.6 μm. The strain effect silicon layer 24 is formed to a thickness of 13 nm. The thickness of the strain effect silicon layer 24 may be set at a value allowing the strain effect silicon layer 24 to exhibit a strain effect, for example, in a range of 5 nm to 30 nm, preferably, in a range of 5 nm to 15 nm.

An isolation region 51 having a trench structure for electrically isolating a region in which an n-channel type field effect transistor 1 is to be formed from a region in which a p-channel type field effect transistor 3 is to be formed, is formed to a depth from the strain effect silicon layer 24 to an upper portion of the relax layer 23. A p-well 25 is formed, in a region in which the n-channel type field effect transistor 1 is to be formed, to a depth from the strain effect silicon layer 24 to an upper portion of the relax layer 23. An n-well 26 is formed, in a region in which the p-channel type field. effect transistor 3 is to be formed, to a depth from the strain effect silicon layer 24 to an upper portion of the relax layer 23.

In this way, a semiconductor substrate 11 is obtained on which a semiconductor device 5 composed of the n-channel type field effect transistor 1 and the p-channel type field effect transistor 3 is formed.

The n-channel type field effect transistor 1 has the following configuration:

A gate electrode 13 is formed on the strain effect silicon layer 24 through a gate insulating film 12, and a source/a drain 14 and 15 formed of n⁺-type diffusion layers are formed in an upper portion of the strain effect silicon layer 24 on both sides of the gate electrode 13. The gate insulating film 12 is formed of a silicon oxide film having a thickness of 13 nm. The gate electrode 13 is made from polysilicon. The source/drain 14 and 15 are formed such that the junction depth thereof becomes about 6 nm. As a result, the source/drain 14 and 15 are formed only in the strain effect silicon layer 24.

The p-channel type field effect transistor 3 has the following configuration:

A gate electrode 73 is formed on the strain effect silicon layer 24 through a gate insulating film 72, and a source/a drain 74 and 75 formed of p⁺-type diffusion layers are formed in an upper portion of the strain effect silicon layer 24 on both sides of the gate electrode 73. The gate insulating film 72 is formed of a silicon oxide film having a thickness of 13 nm. The gate electrode 73 is made from polysilicon. The source/drain 74 and 75 are formed such that the junction depth thereof becomes about 7 nm. As a result, the source/drain 74 and 75 are formed only in the strain effect silicon layer 24.

In the above semiconductor device 5, since the source/drain 14 and 15 of the n-channel type field effect transistor 1 and the source/drain 74 and 75 of the p-channel type field effect transistor 3 are formed only in the strain effect silicon layer 24, the junction of the source/drain 14 and 15 and the junction of the source/drain 74 and 75 are present in the strain effect silicon layer 24, to thereby suppress occurrence of junction leak of each transistor.

Since the channel layer of the n-channel type field effect transistor 1 is formed in the strain effect silicon layer 24, a silicon network is applied with a tensile stress due to a difference in lattice constant between silicon of the strain effect silicon layer 24 and silicon germanium of the underlying relax layer 23. Accordingly, degeneration at a bottom of a conduction band is released and the effective mass of electrons is made small, so that the mobility of electrons in a reversal layer near an interface of silicon/silicon oxide is nearly doubled. As a result, a mutual inductance gm of an nMOS transistor is improved to a value being nearly doubled.

Further, since the source/drain 14 and 15 and the source/drain 74 and 75 are formed in one strain effect silicon layer 24, the semiconductor device 5 is allowed to have a simple structure being substantially similar to a related art CMOS structure.

Although the above semiconductor device 5 is configured to include one n-channel type field effect transistor 1 and one p-channel type field effect transistor 3, it may be configured to include a plurality of the n-channel type field effect transistors 1 and a plurality of the p-channel type field effect transistors 3.

Figure 6:
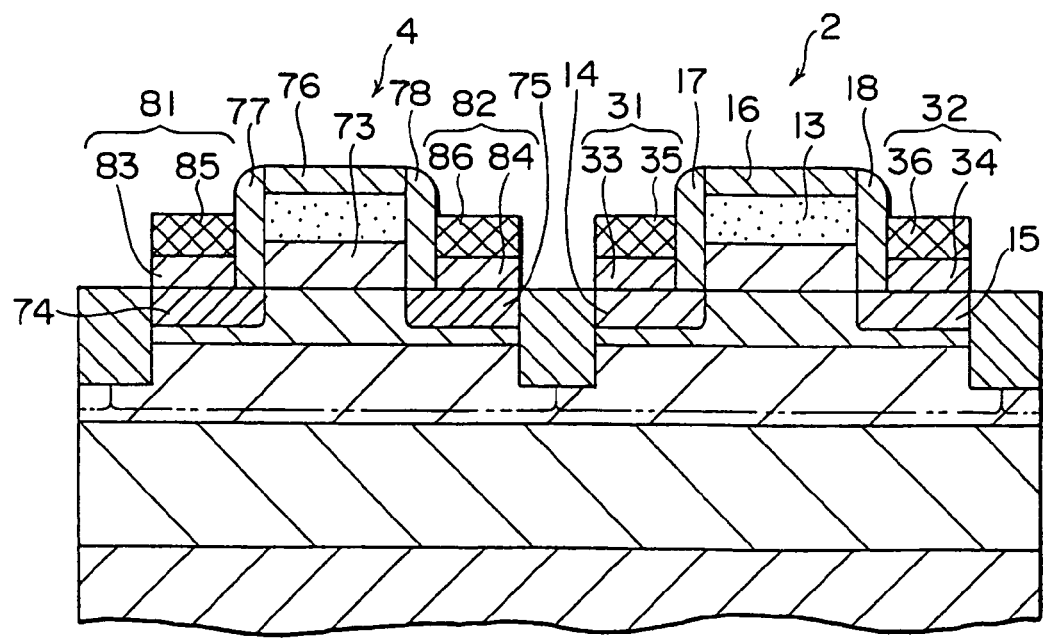
FIG. 6 is a sectional view schematically showing a configuration of a second embodiment of the semiconductor device of the present invention.

A second embodiment of the semiconductor device of the present invention will be described with reference to FIG. 6. In FIG. 6, which schematically shows a configuration of the semiconductor device, parts corresponding to those in FIG. 5 are indicated by the same characters as those in FIG. 5.

As shown in FIG. 6, a field effect transistor 2 is configured that a source/a drain 31 and 32 of an elevated type are formed on the source/drain 14 and 15 in the field effect transistor 1 described with reference to FIG. 5.

The elevated source/drain 31 and 32 are composed of silicon epitaxial layers 33 and 34 and refractory metal silicide layers 35 and 36. The silicon epitaxial layers 33 and 34 are formed on the source/drain 14 and 15, and the refractory metal silicide layers 35 and 36 are formed on the silicon epitaxial layers 33 and 34.

An offset insulating film 16 is formed on a gate electrode 13, and side wall insulating films 17 and 18 are formed on side walls of the gate electrode 13.

The source/drain 14 and 15 may be of a LDD structure in which lightly doped diffusion layers are formed in the strain effect silicon layer 24 at regions under the side wall insulating films 17 and 18.

A field effect transistor 4 is configured that a source/a drain 81 and 82 of elevated type are formed on the source/drain 74 and 75 in the field effect transistor 3 described with reference to FIG. 5.

The elevated source/drain 81 and 82 are composed of silicon epitaxial layers 83 and 84 and refractory metal silicide layers 85 and 86. The silicon epitaxial layers 83 and 84 are formed on the source/drain 74 and 75, and the refractory metal silicide layers 85 and 86 are formed on the silicon epitaxial layers 83 and 84.

An offset insulating film 76 is formed on a gate electrode 73, and side wall insulating films 77 and 78 are formed on side walls of the gate electrode 73.

The source/drain 74 and 75 may be of a LDD structure in which lightly doped diffusion layers are formed in the strain effect silicon layer 24 at regions under the side wall insulating films 77 and 78.

Each of the gate electrodes 13 and 73 may be of a polycide structure. In the case of adopting such a polycide structure, each of the offset insulating film 16 and 76 is not required to be formed.

In the above semiconductor device 5, since the elevated source/drain 31 and 32 and the elevated source/drain 81 and 82 are formed, sheet resistances of the source/drain 14 and 15 and the source/drain 74 and 75 can be reduced in such a state as to keep a shallow junction of each of the source/drain 14 and 15 and the source/drain 74 and 75. This enables high speed operation of interconnections connected to the source/drain 14 and 15 and the source/drain 74 and 75.

Next, a first embodiment of a method of fabricating a semiconductor device according to the present invention will be described in a flow chart shown in FIGS. 7A to 7D. In FIGS. 7A to 7D, parts corresponding to those in FIG. 5 are indicated by the same characters as those in FIG. 5.

Figure 7A:
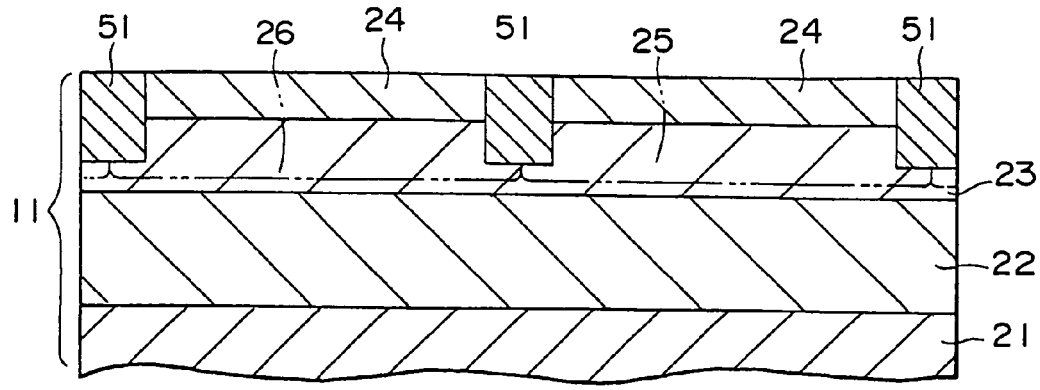
FIGS. 7A to 7D are a flow chart showing a first embodiment of a method of fabricating a semiconductor device according to the present invention.

In accordance with the same procedure as described with reference to FIG. 3A, as shown in FIG. 7A, a buffer layer 22 made from a p$^-$-type silicon germanium (Si$_{1-x}$Ge$_x$) in which the concentration of germanium is changed in the thickness direction is formed on a silicon base 21 to a thickness of 1.6 μm by depositing silicon germanium in such a manner that the composition of germanium is changed from x=0.04 to x=0.3 from the silicon base 21 side to the upper layer side. The silicon base 21 is made from p$^-$-type silicon growth by the CZ process.

A relax layer 23, made from n$^-$-type silicon germanium whose stress is relaxed, is formed on the buffer layer 22 to a thickness of about 0.6 μm by depositing silicon germanium in such a manner that the composition of germanium is set at x=0.3.

A strain effect silicon layer 24 as a semiconductor layer having a strain effect is formed on the relax layer 23 to a thickness of 13 nm. The thickness of the strain effect silicon layer 24 may be set at a value allowing the strain effect silicon layer 24 to exhibit a strain effect, for example, in a range of 5 nm to 30 nm, preferably, in a range of 5 nm to 15 nm.

The strain effect silicon layer 24 is applied with a tensile stress due to a difference in lattice constant between the silicon germanium layer (relax layer 23) and the silicon layer (strain effect silicon layer 24).

The silicon base 21, buffer layer 22, relax layer 23, and strain effect silicon layer 24 constitute a semiconductor substrate 11.

Then, in accordance with a known process of forming an isolation region having a trench structure, an isolation region 51 having a trench structure for electrically isolating a region in which an n-channel type field effect transistor 1 is to be formed from a region in which a p-channel type field effect transistor 3 is to be formed is formed to a depth from the strain effect silicon layer 24 to an upper portion of the relax layer 23.

In addition, the above-described known process of forming an isolation region having a trench structure typically includes the steps of forming a trench in the semiconductor substrate 1 by photolithography and etching, burying the trench with an insulating film, and removing excess insulating film remaining on the semiconductor substrate 11 by etching-back, chemical-mechanical polishing, or the like, thereby forming the isolation region 51.

A p-well 25 is formed by ion implantation, in a region in which an n-channel type field effect transistor 1 is to be formed, to a depth from the strain effect silicon layer 24 to an upper portion of the relax layer 23. At this time, an area in which an n-well 26 is to be formed is covered with a resist mask (not shown).

After removal of the resist mask, an n-well 26 is formed by ion implantation, in a region in which a p-channel type field effect transistor 3 is to be formed, to a depth from the strain effect silicon layer 24 to an upper portion of the relax layer 23. At this time, the p-well 25 is covered with a resist film (not shown). The resist film is removed after ion implantation.

In addition, either of the p-well 25 and the n-well 26 may be earlier formed.

Figure 7B:
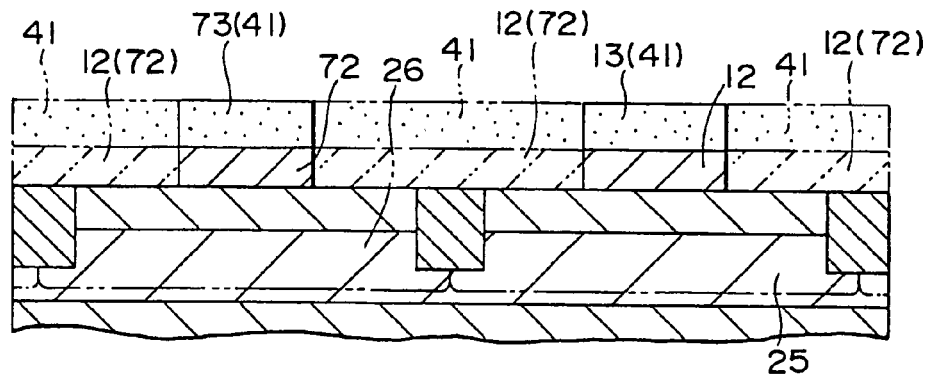
Figure 7C:
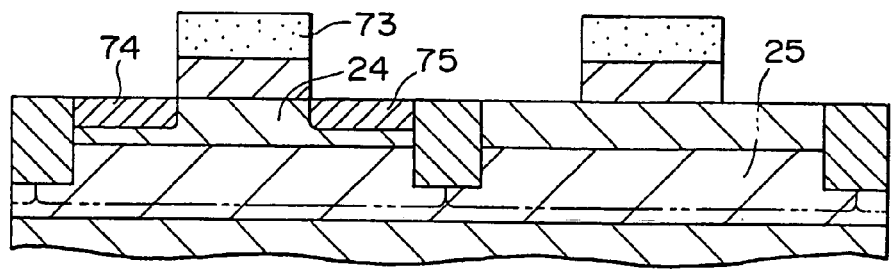
Figure 7D:
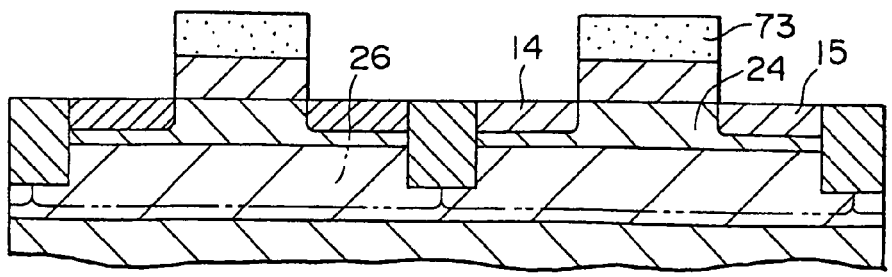

In FIGS. 7B to 7D, the silicon base 21 and the buffer layer 22 are partially omitted.

Next, in accordance with the same procedure as described with reference to FIG. 3B, as shown in FIG. 7B, a gate insulating film 12 (72) made from silicon oxide is formed on the strain effect silicon layer 24. A gate electrode film 41 (indicated by chain lines) made from polysilicon is formed by CVD. A resist film (not shown) is formed by coating of resist and is then patterned by photolithography to form a resist mask (not shown). Then, the gate electrode film 41 is etched using the resist mask as an etching mask, to form a gate electrode 13 for an n-channel type field effect transistor on the gate insulating film 12 and also to form a gate electrode 73 for a p-channel type field effect transistor on the gate insulating film 72. At this etching step, portions of the gate insulating film 12 (72). indicated by chain lines are also etched.

As shown in FIG. 7C, a resist film (not shown) is formed on the p-well 25 by coating of resist and photolithography, and ions of a p-type impurity for forming a source/a drain of a p-channel type field effect transistor are implanted. At this ion implantation step, for example, ions of boron difluoride (BF$_2{}^+$) as the above p-type impurity are implanted in the strain effect silicon layer 24 on both sides of the gate electrode 73 using the gate electrode 73 as a mask, to form an n-type source/a n-type drain 74 and 75 in an upper portion of the strain effect silicon layer 24.

In the case of using ions of boron difluoride (BF$_2{}^+$) as the p-type impurity, the above ion implantation conditions are set as follows: the implantation energy is set at 5 KeV; the ion projection range is set at 5 nm; and the does is set at 3×10$^{15}$ ions/cm$^2$.

Then, the resist mask is removed by oxygen ashing and cleaning treatment.

In addition, a thin oxide film (not shown) may be formed before ion implantation of boron difluoride, and the thin oxide film may be removed after ion implantation.

As shown in FIG. 7D, a resist film (not shown) is formed on the n-well 26 by coating of resist and photolithography, and ions of an n-type impurity for forming a source/a drain of an n-channel type field effect transistor are implanted. At this ion implantation step, for example, ions of arsenic (As$^+$) as the above n-type impurity are implanted in the strain effect silicon layer 24 on both sides of the gate electrode 13 using the gate electrode 13 as a mask, to form an n-type source/a n-type drain 14 and 15 in an upper portion of the strain effect silicon layer 24.

In the case of using ions of arsenic (As$^+$) as the n-type impurity, the above ion implantation conditions are set as follows: the implantation energy is set at 5 KeV; the ion projection range is set at 6 nm; and the does is set at 5×10$^{15}$ ions/cm$^2$.

Then, the resist mask is removed by oxygen ashing and cleaning treatment.

After ion implantation, activation annealing is performed. In the case of furnace annealing, the annealing temperature is set at 800° C. and the annealing time is set at 30 min. In the case of RTA (Rapid Thermal Annealing), for example, ELA (Excimer Laser Annealing), the energy of irradiated laser light is set at 1 J/cm$^2$. Such activation annealing allows formation of the source/drain 14 and 15 having a shallow junction. At the same time, such activation annealing also activates the source/drain 74 and 75.

In this way, there is formed a semiconductor device 5 having the n-channel type field effect transistor 1 and the p-channel type field effect transistor 3.

Although the source/drain 14 and 15 and the source/drain 74 and 75 are formed by ion implantation in this embodiment, they may be formed by laser doping, vapor-phase doping, or solid doping.

In the above-described method of fabricating the semiconductor device, since the source/drain 14 and 15 of the n-channel type field effect transistor 1 and the source/drain 74 and 75 of the p-channel type field effect transistor 3 are formed only in the strain effect silicon layer 24, the junction of the source/drain 14 and 15 and the junction of the source/drain 74 and 75 are formed only in the strain effect silicon layer 24, to thereby suppress occurrence of junction leak of each transistor.

Further, since the source/drain 14 and 15 and the source/drain 74 and 75 are formed in one strain effect silicon layer 24, it is possible to eliminate the need of formation of channel forming layers corresponding to the source/drain 14 and 15 and the source/drain 74 and 75, and hence to simplify the fabrication process.

Figure 8A:
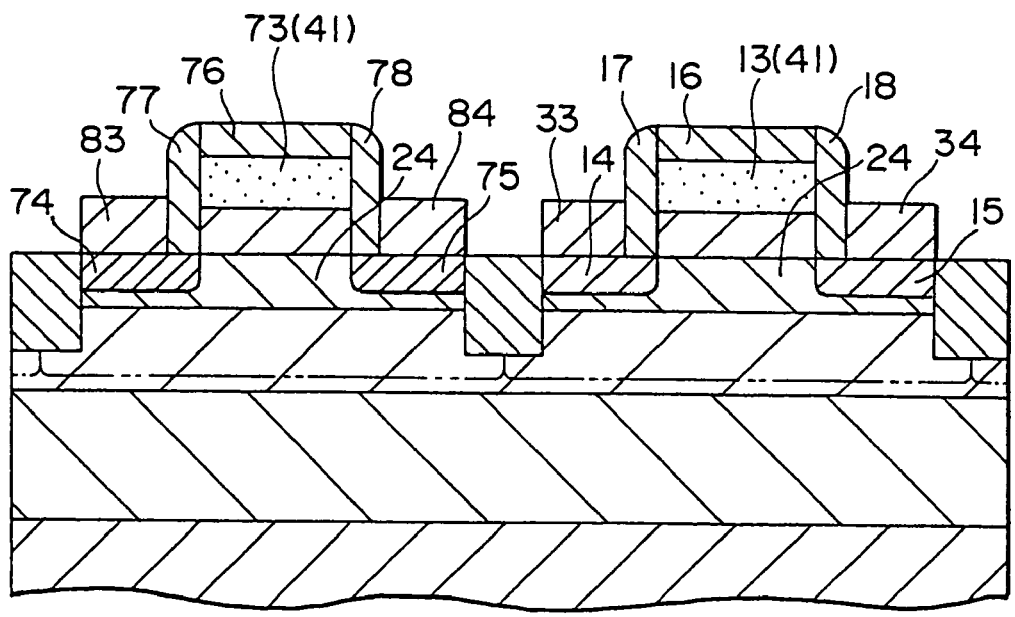
FIGS. 8A and 8B are a flow chart showing a second embodiment of the method of fabricating a semiconductor device according to the present invention.
Figure 8B:
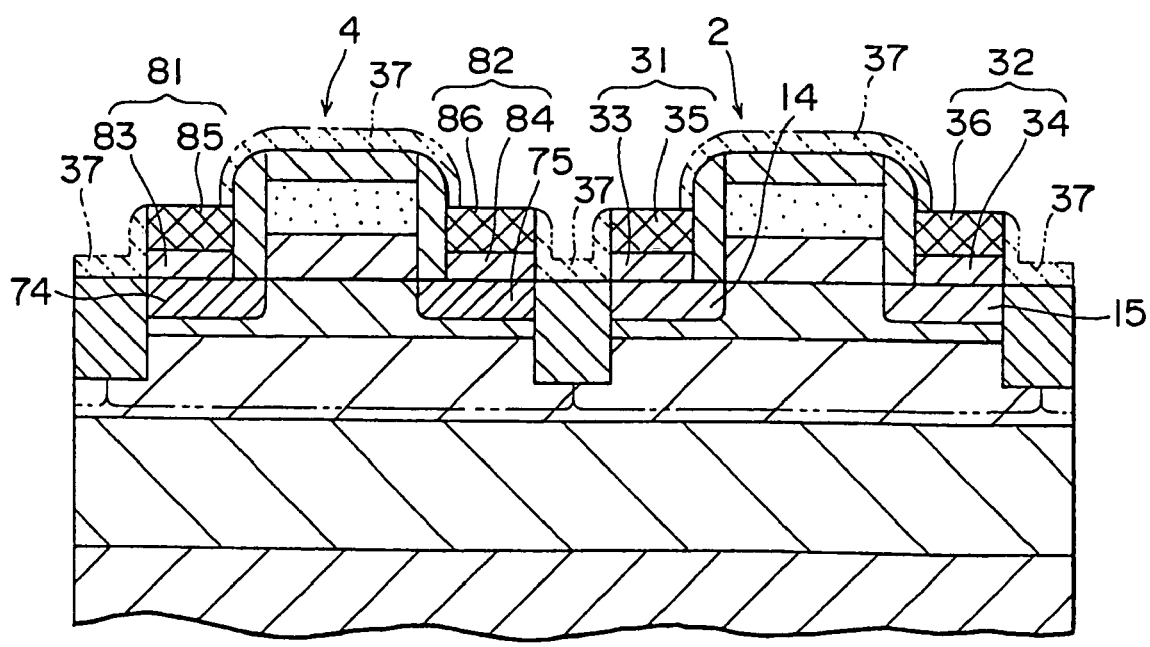

A second embodiment of the method of fabricating a semiconductor device according to the present invention will be described with reference to a flow chart shown in FIGS. 8A and 8B. In FIGS. 8A and 8B, parts corresponding to those in FIGS. 4A and 4B and FIG. 6 are indicated by the same characters as those in FIGS. 4A and 4B and FIG. 6.

After formation of the gate electrode film 41 in accordance with the method of fabricating the semiconductor device described with reference to FIGS. 7A to 7D, as shown in FIG. 8A, an offset insulating film 16 is formed on portions of the gate electrode film (41) forming gate electrodes 13 and 73, followed by patterning of the gate electrodes 13 and 73. Then, a source/a drain 14 and 15 and a source/drain 74 and 75 are formed, and side wall insulating films 17, 18 and side wall insulating films 77 and 78 are formed.

In the case where each of the source/drain 14 and 15 and the source/drain 74 and 75 are of a LDD (Lightly Doped Drain) structure, after patterning of the gate, lightly doped diffusion layers for forming a LDD structure is formed by ion implantation. In this case, the LDD of the p-channel type field effect transistor is formed of p-type lightly doped diffusion layers, and the LDD of the n-channel type field effect transistor is formed of n-type light doped diffusion layers. The side wall insulating films 17 and 18 are then formed on side walls of the gate electrode 13, and the side wall insulating films 77 and 78 are formed on side walls of the gate electrode 73. After that, highly doped regions of each of the source/drain 14 and 15 and the source/drain 74 and 75 are formed by doping (for example, ion implantation) of a suitable impurity.

After that, silicon is selectively deposited on the source/drain 14 and 15 by selective epitaxial growth, to form silicon epitaxial layers 33 and 34 on the source/drain 14 and 15. At the same time, silicon is selectively deposited on the source/drain 74 and 75, to form silicon epitaxial layers 83 and 84 on the source/drain 74 and 75.

Next, in accordance with the same procedure as described with reference to FIG. 4B, as shown in FIG. 8B, a refractory metal (for example, titanium) layer 37 is formed over the entire surface on the side of the silicon epitaxial layers 33, 34, 83 and 84, followed by heat-treatment (for example, RTA), to form refractory metal silicide (for example, titanium silicide) layers 35 and 36 in the silicon epitaxial layers 33 and 34 thereby forming an elevated source/an elevated drain 31 and 32, and also to form refractory metal silicide (for example, titanium silicide) layers 85 and 86 in the silicon epitaxial layers 83 and 84 thereby forming an elevated source/an elevated drain 81 and 82.

After that, an unreacted portion of the refractory metal layer 37 (indicated by chain lines) is removed by etching.

In this way, there is formed a semiconductor device 5 including a field effect transistor 2 having elevated source/drain 31 and 32 and a field effect transistor 4 having the elevated source/drain 81 and 82.

In the above silicification, if the gate electrodes 13 and 73 each having a polycide structure are simultaneously formed, the above offset insulating films 16 and 76 are not required to be formed and the above refractory metal layer 37 may be formed in contact with the gate electrodes 13 and 73.

In the above-described method of fabricating the semiconductor device, since the elevated source/drain 31 and 32 (or 81 and 82) are formed by silicifying the upper portions of the silicon epitaxial layers 33 and 34 (or 83 and 84) deposited on the source/drain 14 and 15 (or 74 and 75), the source/drain 14 and 15 (or 74 and 75) are not silicified. Accordingly, a sheet resistance of the source/drain 14 and 15 can be reduced particularly in such a state as to keep a shallow junction of the source/drain 14 and 15, and similarly a sheet resistance of the source/drain 74 and 75 can be reduced.

Next, a first embodiment of a logic circuit of the present invention will be described with reference to a circuit diagram of FIG. 9. In the following description, parts corresponding to those in FIGS. 1 and 5 are indicated by the same characters as those in FIGS. 1 and 5.

Figure 9:
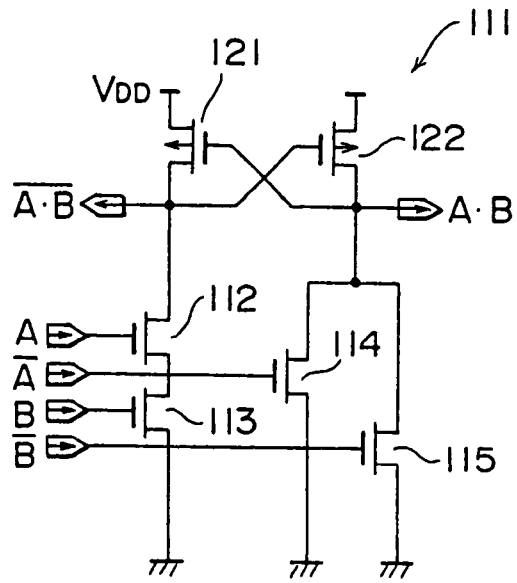
FIG. 9 is a circuit diagram showing a first embodiment of a logic circuit of the present invention.

A logic circuit 111 shown in FIG. 9 is equivalent to a circuit configuration disclosed in ISSCC Dig. Tech. Papers, "Cascode Voltage Switch Logic: A Differential CMOS Logic Family", [February.] (1984) Heller, L. G. and Griffin, W. R., P16-17. And, as the feature of the logic circuit of the present invention, n-channel type field effect transistors (nMOSs) 112 to 115 constituting logic and p-channel type field effect transistors (pMOSs) 121 and 122 constituting pMOS crossing latch are formed in the strain effect silicon layer 24 formed in an upper layer of the semiconductor substrate 11 described with reference to FIGS. 1 and 5.

To be more specific, each source/drain (not shown) of the nMOSs 112 to 115 are formed only in the strain effect silicon layer 24, and also each source/drain of the pMOSs 121 and 122 are formed only in the strain effect silicon layer 24.

In the above logic circuit 111, since each source/drain of the nMOSs 112 to 115 are formed only in the strain effect silicon layer 24, the junction of the source/drain is present in the strain effect silicon layer 24, to suppress occurrence of a junction leak, thereby improving the reliability of the logic circuit 111.

In the logic circuit 111, as described above, the nMOSs 112 to 115 constitute logic and the pMos 121 and 122 constitute crossing latch. In this case, when the output is changed to reverse the pMOS crossing latch, a DC current is allowed to flow in the logic circuit, and when the change of the output is terminated, the flow of the DC current is stopped. Further, as the feature of the logic circuit 111, an electric field applied to each transistor is relaxed upon operation, to suppress a reduction in mobility of electrons, thereby enabling high speed operation of the logic circuit.

Since the channel layer of the nMOS is formed in the strain effect silicon layer 24, a silicon network is applied with a tensile stress due to a difference in lattice constant between silicon of the strain effect layer 24 and silicon germanium of the relax layer 23. As a result, degeneration of a bottom of a condition band is released, to reduce an effective mass of electrons, thereby allowing the mobility of electrons to be substantially doubled. Thus, the mutual conductance gm of the n-MOS transistor is improved to a value being nearly doubled. On the other hand, since each of the pMOSs 121 and 122 does not require a high performance, it can be configured with less number of elements. In this way, there is obtained a logic circuit which enables a high speed operation at a low voltage.

A second embodiment of the logic circuit of the present invention will be described with reference to a circuit diagram of FIG. 10. In the following description, parts corresponding to those in FIGS. 1 and 5 are indicated by the same characters as those in FIGS. 1 and 5.

Figure 10:
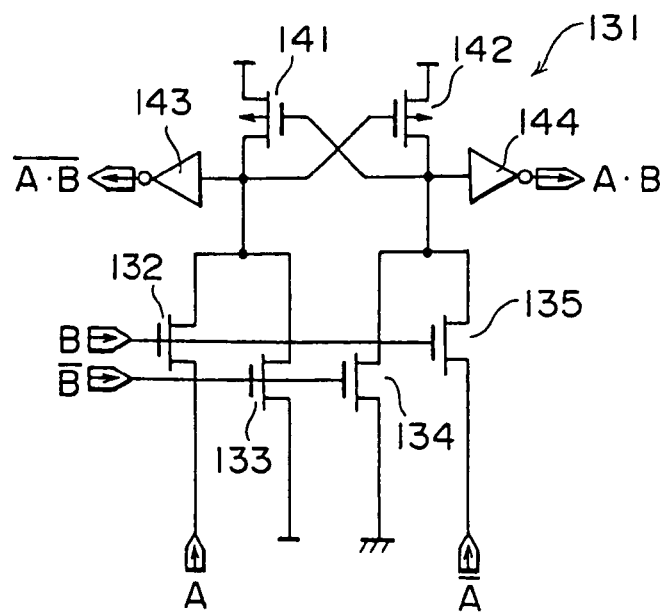
FIG. 10 is a circuit diagram showing a second embodiment of the logic circuit of the present invention.

A logic circuit 131 shown in FIG. 10, which is equivalent to a circuit configuration disclosed in IEEE J, Solid-state Circuits, "A 3.8-ns CMOS 16×16-b Multiplier Using Complementary Pass-Transistor Logic", 25 [2] (1990) Yano, K. et al., p338-395, is one basic circuit using a pass-transistor logic. To be more specific, the logic circuit is formed of nMOS transistors. And, as the feature of the logic circuit of the present invention, n-channel type field effect transistors (nMOSs) 132 to 135 constituting pass-transistor logic, CMOS invertors 143 and 144, and p-channel type field effect transistors (pMOSs) 141 and 142 for compensating an output level are formed in the strain effect silicon layer 24 formed in an upper layer of the semiconductor substrate 11 described with reference to FIGS. 1 and 5.

To be more specific, each source/drain (not shown) of the n-MOSs 132 to 135 are formed only in the strain effect silicon layer 24, and also each source/drain (not shown) of the pMOSs 141 and 142 and each source/drain (not shown) of the CMOS invertors 143 and 144 are formed only in the strain effect silicon layer 24.

In the above logic circuit 131, since the source/drain of each of the nMOSs 132 to 135 are formed only in the strain effect silicon layer 24, the junction of each source/drain is present in the strain effect silicon layer 24, to suppress occurrence of a junction leak, thereby improving the reliability of the logic circuit 131.

In the above logic circuit 131, for example, the logic is constituted by the nMOS pass-transistors, and the CMOS invertors 143 and 144 provided on the output side act to return a [H] level to the original value when the [H] level is reduced from $V_{DD}$ a value corresponding to a threshold voltage of the nMOSs by allowing a signal of the [H] level to pass through the nMOS pass-transistors, and to reinforce a driving force of a load. Further, the output level is compensated by the crossing latch of the pMOSs 141 and 142. That is, the [H] level is corrected at the value of $V_{DD}$. The correction does not require a driving force of the pMOSs 141 and 142. In addition, to suppress delay of a reversal operation of the crossing latch of the pMOSs 141 and 142, the pMOSs 141 and 142 may be designed such that the channel width becomes large and the channel length becomes short.

A third embodiment of the logic circuit of the present invention will be described with reference to a circuit diagram of FIG. 11. In the following description, parts corresponding to those in FIGS. 1 and 5 are indicated by the same characters as those in FIGS. 1 and 5.

Figure 11:
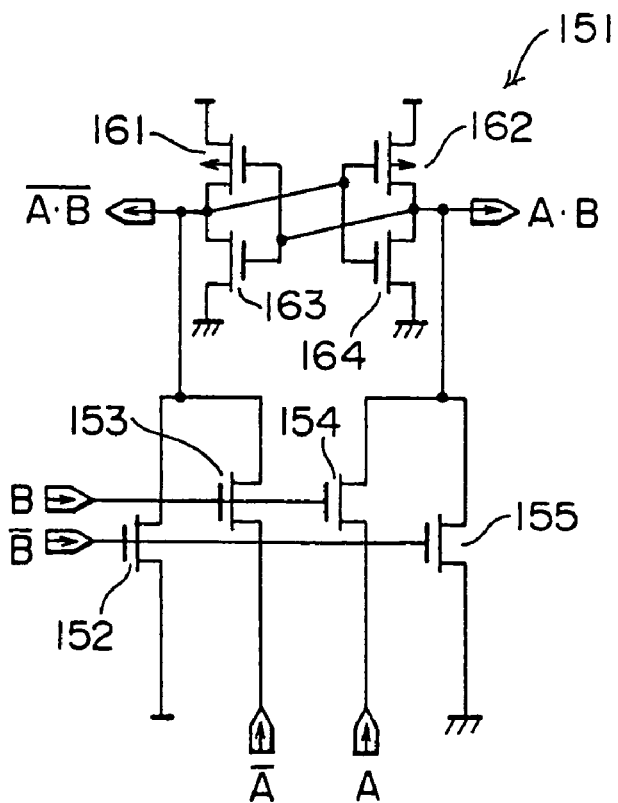
FIG. 11 is a circuit diagram showing a third embodiment of the logic circuit of the present invention.

A logic circuit 151 shown in FIG. 11, which is equivalent to a circuit configuration disclosed in Proc. IEEE 1994 CICC, "A High Speed, Low Power, Swing Restored Pass-Transistor Logic Based Multiply and Accumulate Circuit for Multimedia Applications", [May] (1994) Prameswer, A., Hara, H., and Sakurai, T., p358-362, is one basic circuit using a pass-transistor logic. That is, an nMOS pass-transistor logic and a CMOS latch are used in this logic circuit. And, as the feature of the logic circuit of the present invention, n-channel type field effect transistors (nMOSs) 152 to 155 constituting the pass-transistor logic, p-channel type field effect transistors (pMOSs) 161 and 162 constituting the CMOS latch, and n-channel type field effect transistors (nMOSS) 163 and 164 are formed in the strain effect silicon layer 24 formed on an upper layer of the semiconductor substrate 11 described with reference to FIGS. 1 and 5.

To be more specific, each source/drain (not shown) of the nMOSs 152 to 155 and the nMOSs 163 and 164 are formed only in the strain effect silicon layer 24, and also each source/drain (not shown) of the pMOSs 161 and 162 are formed only in the strain effect silicon layer 24.

In the above logic circuit 151, since each source/drain of the nMOSs 152 to 155 are formed only in the strain effect silicon layer 24, the junction of each source/drain is present in the strain effect silicon layer 24, to suppress occurrence of a junction leak, thereby improving the reliability of the logic circuit 151.

Further, the CMOS latch is operated by push-pull and thereby has a large operational margin as compared with the pMOS latch, and also the CMOS latch is higher in operational speed because it is not applied with a static current. As a result, the logic circuit 151 is made smaller in power consumption and higher in operational speed as compared with the logic circuit 131.

The logic circuit 151 has an advantage that the optimum region of a delay time can be extended even when a ratio of each gate width of the pMOS and nMOS to the pass-transistor of the nMOS configuration. Accordingly, the design margin is enlarged, leading to the increased manufacturing margin.

In addition, the above description for the logic circuits 111, 131, and 151 is for only illustrative purposes, and the configuration on which the field effect transistor 1 or the semiconductor device 5 is formed in the strain effect silicon layer 24 described with reference to FIGS. 1 and 5 can be applied to other logic circuits using the pass-transistor network, for example, a DSL (Differential Split-Level Logic), and DCVSPG (Differential Cascode Voltage Switch with the Pass-Gate).

Figure 12:
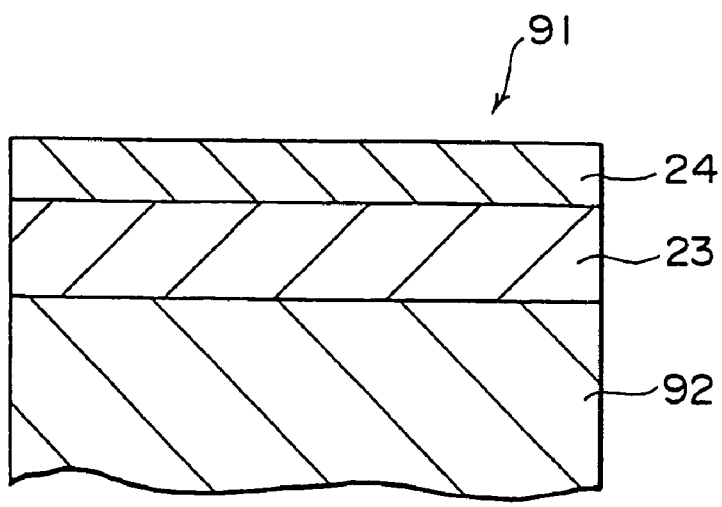
FIG. 12 is a sectional view schematically showing an embodiment of a semiconductor substrate.

Next, one embodiment of a semiconductor substrate of the present invention will be described with reference to FIG. 12. In FIG. 12, which schematically shows a configuration of the semiconductor substrate, parts corresponding to those in FIG. 1 are indicated by the same characters as those in FIG. 1.

As shown in FIG. 12, a semiconductor substrate 91 includes a germanium base 92 on which a relax layer 23 and a strain effect silicon layer 24 as a semiconductor layer having a strain effect are formed in this order. The relax layer 23 is made from n⁻-type (or p⁻-type) silicon germanium ($Si_{0.7}Ge_{0.3}$) whose stress is relaxed, and is formed to a thickness of about 0.6 μm. In addition, the composition of germanium is not limited to the above value and may be suitably selected. The strain effect silicon layer 24 is the same as described with reference to FIG. 1.

In the above semiconductor substrate 91, since the base is formed of the germanium base 92, the relax layer 23 formed of the silicon germanium layer whose stress is relaxed can be directly formed on the germanium base 92 without formation of a buffer layer. That is, since misalignment in lattice between the germanium base 92 and the relax layer 23 is suppressed, the relax layer 23 can be directly formed on the germanium base 92.

This is effective to simplify the structure of the semiconductor substrate 92, and to simplify the process of forming the semiconductor substrate 91.

The semiconductor substrate 11 described with reference to FIG. 1 can be replaced with the above semiconductor substrate 91 described with reference to FIG. 12. To be more specifically, the field effect transistor 1 described with reference to FIG. 1 can be formed in the strain effect silicon layer 24 of the semiconductor substrate 91.

Further, the semiconductor substrate 11 described with reference to FIG. 5 can be replaced with the semiconductor substrate 91 described with reference to FIG. 12. To be more specific, the semiconductor device 5 described with reference to FIG. 5 can be formed in the strain effect silicon layer 24 of the semiconductor substrate 91.

While the preferred embodiments of the present invention have been described, such description is for illustrative purposes only, and it is to be understood that many changes and variations may be made without departing from the spirit or scope of the following claims.

What is claimed is:

1. A semiconductor device comprising:
   a p-channel type field effect transistor and an n-channel type field effect transistor both formed in a semiconductor layer which has a strain effect and which is formed in an upper layer of a semiconductor substrate,
   wherein a source/a drain of said p-channel type field effect transistor and a source/a drain of said n-channel type field effect transistor are formed only in said semiconductor layer having the strain effect,
   wherein said semiconductor layer having the strain effect comprises a silicon layer having a strain effect, and
   wherein said semiconductor substrate comprises:
   a silicon base;
   a buffer layer formed on said silicon base, said buffer layer being made from silicon germanium in which the concentration of germanium is changed in the thickness direction;
   a relax layer formed on said buffer layer, said relax layer being made from silicon germanium whose stress is relaxed; and
   a silicon layer formed on said relax layer, said silicon layer having a strain effect.

2. A semiconductor device according to claim 1, wherein each of said p-channel type field effect transistor and said n-channel type field effect transistor comprises:
   silicon epitaxial layers formed on said source/drain; and
   refractory metal silicide layers formed on said silicon epitaxial layers.

3. A semiconductor device according to claim 1, wherein said semiconductor substrate comprises:
   a germanium base;
   a relax layer formed on said germanium base, said relax layer being composed of a silicon germanium layer whose stress is relaxed; and
   a silicon formed on said relax layer, said silicon layer having a strain effect.

4. A semiconductor device, comprising
   a semiconductor substrate having a buffer layer on a silicon base layer, wherein the buffer layer is made of a P⁻type silicon germanium,
   a relax layer on the buffer layer, wherein the relax layer is made of P⁻type silicon germanium which is relaxed, and
   a silicon strain effect layer on the relax layer;
   a gate electrode of a p-channel type field effect transistor and a gate electrode of a n-channel type field effect transistor on said strain effect silicon layer through a gate insulating film;
   a source and a drain each composed of p-type diffusion layer only in said silicon strain effect layer on both sides of said gate electrode of said p-channel type field effect transistor, the source and drain of the p-type diffusion layers being formed to a depth of less than a depth of the strain effect silicon layer;
   a source and a drain each composed of n-type diffusion layer only in said strain effect silicon layer on both sides of said gate electrode of said n-channel type field effect transistor, the source and drain of the n-type diffusion layers being formed to a depth of less than a depth of the strain effect silicon layer; and
   an isolation region in between the p-channel type field effect transistor and the n-channel type field effect transistor in said strain effect silicon layer.

5. The semiconductor device according to claim 4, wherein the buffer layer is constructed of $Si_{1-x}Ge_x$, wherein a concentration of germanium of the buffer layer changes from X=0.04 to X=0.3 from a side of the buffer layer opposite to the relax layer to a side of the buffer layer proximate the relax layer.

6. The semiconductor according to claim 4, wherein the relax layer is formed of $Si_{1-x}Ge_x$, wherein a concentration of germanium of the relax layer is X=0.3.

7. A semiconductor device, comprising:
   a semiconductor substrate having a silicon layer having a strain effect in an upper layer of said semiconductor substrate, a relax layer below the silicon layer having the strain effect, and a buffer layer below the relax layer;
   a gate electrode of a p-channel type field effect transistor on said strain effect silicon layer through a gate insulating film;
   a source and a drain each composed of p-type diffusion in only said strain effect silicon layer on both sides of said gate electrode of said p-channel type field effect transistor, the source and drain of the p-type diffusion layers being formed to a depth of less than a depth of the strain effect silicon layer;
   a source and a drain each composed of n-type diffusion layer in only said strain effect silicon layer on both sides of a gate electrode of an n-channel type field effect transistor, the source and drain of the n-type diffusion layers being formed to a depth of less than a depth of the strain effect silicon layer;
   an isolation region in between the p-channel type field effect transistor and the n-channel type field effect transistor in said silicon layer having the strain effect; and
   wherein the buffer layer is constructed of a P⁻type silicon germanium, wherein the relax layer is made from a P⁻type silicon germanium whose stress is relaxed.

8. The semiconductor device of claim 7, wherein the semiconductor substrate includes:
   the buffer layer located on a silicon base layer;
   a relax layer on the buffer layer; and
   the silicon stain effect layer on the relax layer on the buffer layer.

9. The semiconductor of claim 8, wherein the relax layer is formed of n-type silicon germanium.

10. The semiconductor of claim 7, wherein a semiconductor substrate having the strain effect silicon layer causes the strain effect silicon layer to exhibit a strain effect in the range of 5 nm to 30 nm.

11. The semiconductor according to claim 7, wherein the buffer layer is constructed of $Si_{1-x}Ge_x$, wherein a concentration of germanium of the buffer layer proximate the relax layer changes from X=0.04 to X=0.3 from a side of the buffer layer proximate the relax layer.

12. The semiconductor according to claim 7, wherein the relax layer is formed of $Si1-xGex3$ wherein a concentration of germanium of the relax layer is X=0.3.

* * * * *

UNITED STATES PATENT AND TRADEMARK OFFICE
CERTIFICATE OF CORRECTION

PATENT NO. : 7,355,214 B2 Page 1 of 1
APPLICATION NO. : 10/752705
DATED : April 8, 2008
INVENTOR(S) : Takashi Noguchi et al.

It is certified that error appears in the above-identified patent and that said Letters Patent is hereby corrected as shown below:

Column 18, Line 62:
"Si1-xGex3" should read -- $Si_{1-x}Ge_x$ --.

Signed and Sealed this

Twenty-ninth Day of July, 2008

JON W. DUDAS
*Director of the United States Patent and Trademark Office*